(12) United States Patent
Kasemodel et al.

(10) Patent No.: US 12,108,542 B2
(45) Date of Patent: Oct. 1, 2024

(54) SYSTEM AND METHOD FOR CREATING ORTHOGONAL SOLDER INTERCONNECTS

(71) Applicant: Raytheon Company, Waltham, MA (US)

(72) Inventors: Justin A. Kasemodel, McKinney, TX (US); Justin E. Stroup, McKinney, TX (US); Allen L. Kelly, McKinney, TX (US); Amanda M. Couch, McKinney, TX (US); Randy L. Smith, Dallas, TX (US)

(73) Assignee: Raytheon Company, Tewksbury, MA (US)

( * ) Notice: Subject to any disclaimer, the term of this patent is extended or adjusted under 35 U.S.C. 154(b) by 433 days.

(21) Appl. No.: 17/011,447

(22) Filed: Sep. 3, 2020

(65) Prior Publication Data
US 2021/0076505 A1 Mar. 11, 2021

Related U.S. Application Data

(60) Provisional application No. 62/896,888, filed on Sep. 6, 2019.

(51) Int. Cl.
*H05K 3/34* (2006.01)
*B23K 1/00* (2006.01)
(Continued)

(52) U.S. Cl.
CPC ......... *H05K 3/3494* (2013.01); *B23K 1/0016* (2013.01); *B23K 37/0426* (2013.01);
(Continued)

(58) Field of Classification Search
None
See application file for complete search history.

(56) References Cited

U.S. PATENT DOCUMENTS 3,644,980 A * 2/1972 Class, Jr. ........... H05K 13/0491
29/762
4,493,449 A 1/1985 Kleiman
(Continued)

FOREIGN PATENT DOCUMENTS

CA 2258403 A1 7/2000

OTHER PUBLICATIONS

International Search Report and Written Opinion from related PCT Application No. PCT/US2020/049371, mailed Jan. 26, 2021.

*Primary Examiner* — Devang R Patel (57) ABSTRACT

An apparatus and method for soldering an electrical component to a circuit board includes a stage positioning the circuit board and electrical component in alignment with a solder tip along an axis. A first spring-loaded compression mechanism maintains contact between the circuit board and the electrical component, and a second spring-loaded compression mechanism brings the soldering tip into thermal contact with the circuit board and the electrical component such that solder disposed adjacent to the circuit board and the electrical component melts. When the second spring-loaded compression mechanism removes its applied force such that the soldering tip comes out of contact with the circuit board, the first spring-loaded compression mechanism maintains the contact between the circuit board and the electrical component while the solder cools and solidifies.

20 Claims, 5 Drawing Sheets

(51) Int. Cl.
*B23K 37/04* (2006.01)
*B23K 101/42* (2006.01)
*H05K 1/02* (2006.01)
*H05K 1/11* (2006.01)

(52) U.S. Cl.
CPC ........ *B23K 2101/42* (2018.08); *H05K 1/0206* (2013.01); *H05K 1/113* (2013.01); *H05K 3/3436* (2013.01); *H05K 2203/0195* (2013.01); *H05K 2203/1121* (2013.01)

(56) References Cited

U.S. PATENT DOCUMENTS

| | | | | |
|---|---|---|---|---|
| 4,606,492 | A * | 8/1986 | Guslits | B23K 3/00 228/52 |
| 4,832,246 | A | 5/1989 | Ono et al. | |
| 6,152,353 | A * | 11/2000 | Sani-Bakhtiari | H05K 3/3421 228/180.1 |
| 6,629,631 | B2 * | 10/2003 | Murtishaw | B23K 3/033 228/103 |
| 7,699,208 | B2 * | 4/2010 | Forti | B23K 3/047 228/54 |
| 2007/0075717 | A1 * | 4/2007 | Kinghorn | G01R 1/07378 324/754.18 |
| 2008/0296266 | A1 | 12/2008 | Okada et al. | |
| 2009/0050673 | A1 | 2/2009 | Althoff et al. | |
| 2017/0135254 | A1 | 5/2017 | Yang et al. | |

* cited by examiner

SYSTEM AND METHOD FOR CREATING ORTHOGONAL SOLDER INTERCONNECTS

CROSS REFERENCE TO RELATED APPLICATIONS

This application claims priority to and the benefit of U.S. Provisional Patent Application No. 62/896,888, filed on Sep. 6, 2019, entitled, "AUTOMATED SOLDER ROBOT TIP DESIGN FOR ORTHOGONAL SOLDER INTERCONNECTS," the entire contents of which are incorporated herein by reference.

BACKGROUND

1. Technical Field

The present disclosure is related to assembly of circuit boards and, in particular, to systems and methods for soldering components to circuit boards usable with robotic positioning and soldering systems.

2. Discussion of Related Art

In robotic assembly of a circuit board, the circuit board, which includes a pattern of previously formed solder pads, is typically supported in a movable stage, with a solder tip located vertically above the circuit board and movable stage. A component to be fixedly mounted on the circuit board is positioned such that at least one of its conductive contact pads, leads or pins is in close proximity to or in contact with one of the solder pads on the circuit board. To attach the component contact to the circuit board, the stage, and, therefore, the circuit board, is controlled to move such that the associated circuit board solder pad is located directly under the solder tip. Next, the solder tip is activated to produce sufficient heat to melt the solder, and the tip is moved down to contact the circuit board. This contact between the solder tip and the circuit board serves two purposes. First, it applies mechanical pressure to maintain physical contact between the circuit board and the component contact. Second, it applies heat to the area around the solder pad to melt the solder such that it "reflows" around the associated conductive pad of the circuit board and the contact of the component. After the solder has completely melted and reflowed, the solder tip is removed, such that the solder is allowed to cool and solidify, leaving a new solder joint between the conductive pad of the circuit board and the contact of the component.

This conventional approach has some drawbacks. For example, after the solder tip is removed but before the solder has solidified, because the circuit board and component contact are no longer being physically held together, they may move relative to each other or even completely separate, which can result in a faulty or failed solder joint.

SUMMARY

According to one aspect, an apparatus for soldering an electrical component to a circuit board is provided. The apparatus includes a stage for positioning the circuit board and electrical component in alignment with a solder tip along an axis. A first spring-loaded compression mechanism applies a first force to the circuit board and electrical component to maintain contact between the circuit board and the electrical component when the first spring-loaded compression mechanism is forced toward the circuit board and the electrical component along the axis. A second spring-loaded compression mechanism applies a second force along the axis to the soldering tip to bring the soldering tip into thermal contact with the circuit board and the electrical component such that solder disposed adjacent to the circuit board and the electrical component melts. When the second spring-loaded compression mechanism removes the second force such that the soldering tip comes out of contact with the circuit board, the first spring-loaded compression mechanism maintains the contact between the circuit board and the electrical component while the solder cools and solidifies.

In some exemplary embodiments, the first and second spring-loaded compression mechanisms comprise first and second springs, respectively, a spring constant of the first spring being less than a spring constant of the second spring. The first spring-loaded compression mechanism can include an annular collar at an end of the first spring, the solder tip being coaxial with the first spring and movable along the axis through the annular collar within the first spring. The first and second spring-loaded compression mechanisms can include first and second compression force adjusters, respectively, for individually adjusting the first and second springs, respectively, to independently control the first and second forces, respectively.

In some exemplary embodiments, the component is being mounted on a top side of the circuit board, and the solder tip makes contact with a bottom side of the circuit board opposite the top side of the circuit board.

In some exemplary embodiments, the apparatus is connectable to a robotic system, the robotic system controlling positioning of the stage and movement of the first and second spring-loaded compression mechanisms along the axis.

According to another aspect, a method for soldering an electrical component to a circuit board is provided. The method includes: positioning the circuit board and electrical component in alignment with a solder tip along an axis; applying a first force with a first spring-loaded compression mechanism to the circuit board and electrical component to maintain contact between the circuit board and the electrical component when the first spring-loaded compression mechanism is forced toward the circuit board and the electrical component along the axis; and applying a second force with a second spring-loaded compression mechanism along the axis to the soldering tip to bring the soldering tip into thermal contact with the circuit board and the electrical component such that solder disposed adjacent to the circuit board and the electrical component melts. When the second spring-loaded compression mechanism removes the second force such that the soldering tip comes out of contact with the circuit board, the first spring-loaded compression mechanism maintains the contact between the circuit board and the electrical component while the solder cools and solidifies.

In some exemplary embodiments, the first and second spring-loaded compression mechanisms comprise first and second springs, respectively, a spring constant of the first spring being less than a spring constant of the second spring. The first spring-loaded compression mechanism can include an annular collar at an end of the first spring, the solder tip being coaxial with the first spring and movable along the axis through the annular collar within the first spring. The method can further include individually adjusting the first and second springs to independently control the first and second forces, respectively.

In some exemplary embodiments, the component is being mounted on a top side of the circuit board, and the solder tip makes contact with a bottom side of the circuit board opposite the top side of the circuit board.

In some exemplary embodiments, the method can be carried out under control of a robotic system.

BRIEF DESCRIPTION OF THE DRAWINGS

The present technology is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

According to the present disclosure, a system and method for providing an orthogonal interconnect on the underside of a circuit board is provided. The solder tip itself utilizes a spring to keep the circuit board and component assembly under compression during the solder solidification phase and keeps the assembly planar. This is in contrast to typical conventional soldering robots, which use a standard solder tip in addition to a solder feeder. In these conventional systems, there is no compression after the solder is reflowed since, typically, the joint to be made is on the same side of the assembly as the solder tip.

According to the present disclosure, a solder tip assembly is configured to reflow a solder joint on the underside of a circuit board, while allowing the joint to cool under compression. This is especially useful when mating two interfaces together and preventing them from opening back up while the solder cools back to the solid state. The configuration of the present disclosure uses a soldering tip mountable to a robot with a spring-loaded compression collar around the solder tip itself. The tip assembly is lowered to bring the spring-loaded compression collar into contact with the circuit board. The tip itself is then further lowered through the collar and makes contact to apply heat and reflow the joint. The tip then lifts up slightly, removing the heat while keeping the spring-loaded compression collar in contact with the board, allowing the solder joint to cool without needing to turn the soldering tip on and off during joint reflow processes.

The soldering technology of the present disclosure is usable with a standard robot in addition to a fixture used to accommodate the approach. The fixture is used to maintain compression on the solder parts without needing to feed solder, throttle solder tip temperature, or cycle power to the solder tip. The system of the disclosure can be retrofitted into any robotic machine, regardless of whether the machine was designed for automated soldering.

FIGS. 1 through 5 include schematic cross-sectional diagrams of a soldering system 100, through multiple steps in a process of creating a solder joint, according to some exemplary embodiments. Referring to FIGS. 1 through 5, solder system components are mounted to and suspended beneath a movable platform 102 via a vertically movable actuator arm 104. A circuit board 120 includes a "bottom" side 123 and a "top" side 121 on which components 130A and 130B are to be installed by soldering. Circuit board 120 is positioned in an inverted configuration, i.e., top side down, over a movable table or stage 118, which is movable in at least two dimensions to position circuit board 120 as desired beneath solder tip 106.

Components 130A and 130B include conductive contact pads, leads or pins to be soldered to respective solder pads 126A, 126B, 126C formed on top side 121 of circuit board 120 after reflowing of solder 128A, 128B, 128B formed on 126A, 126B, 126C. Specifically, component 130A is shown as having two contact pads, and component 130B is shown as having a single contact pad. Solder pads 126A, 126B, 126C are thermally conductively coupled to conductive pads 122A, 122B, 122C, respectively, formed on bottom side 123 of circuit board 120 by conductively plated through vias 124A, 124B, 124C, respectively.

Solder tip 106 is disposed within a first compression spring 110, which is held at its upper end by a circuit board compression force adjusting collar 112. A circuit board compression collar 108 is fixed to the lower end of compression spring 110. Vertical adjustment of the position of collar 112 with respect to solder tip 106 is used to adjust the force applied to circuit board 120 by circuit board compression collar 108. A second compression spring 116, having a higher spring constant than first compression spring 110, is captured between the lower side of platform 102 at its upper end by and a solder tip compression force adjusting collar 114. Vertical adjustment of the position of collar 114 with respect to solder tip 106 is used to adjust the force applied to circuit board 120 by solder tip 106.

The technology of the disclosure provides fixtureless circuit board solder reflow of components. Two solderable interfaces are mated together and are prevented from separating with the solder cools back to a solid state, without having to cycle power to the solder iron. The solder joint is allowed to cool under compression. The solder fixture of the disclosure is mountable to a robot with dual compression mechanisms to provide force on the circuit board and the solder tip. The circuit board-to-component compression mechanism includes collar 112, compression spring 110 and circuit board compression collar 108; the solder tip compression mechanism includes collar 114 and compression spring 116. Compression force of the assembly is controlled separately from solder tip contact pressure. Each is adjustable independently using different springs. Circuit board compression collar 108 comes down first, applying compression force to the circuit board. Then, the solder tip moves, making contact and reflowing the joint. The tip then lifts up slightly, keeping the compression collar in contact with the circuit board, allowing the solder joint to cool without needing to turn the soldering tip on and off.

Figure 1:
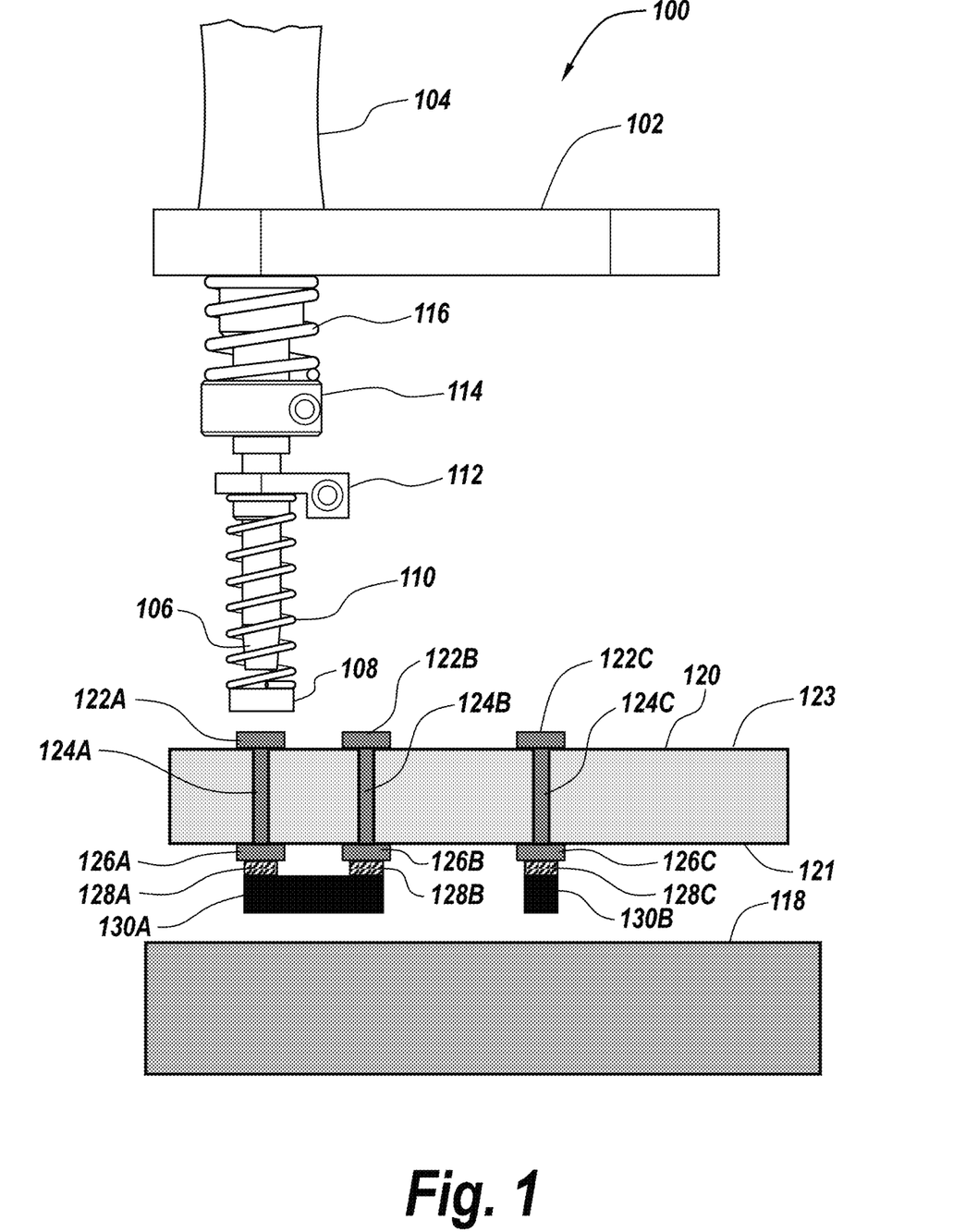
FIGS. 1 through 5 include schematic cross-sectional diagrams of a soldering system, through the process of creating a solder joint, according to some exemplary embodiments.
Figure 2:
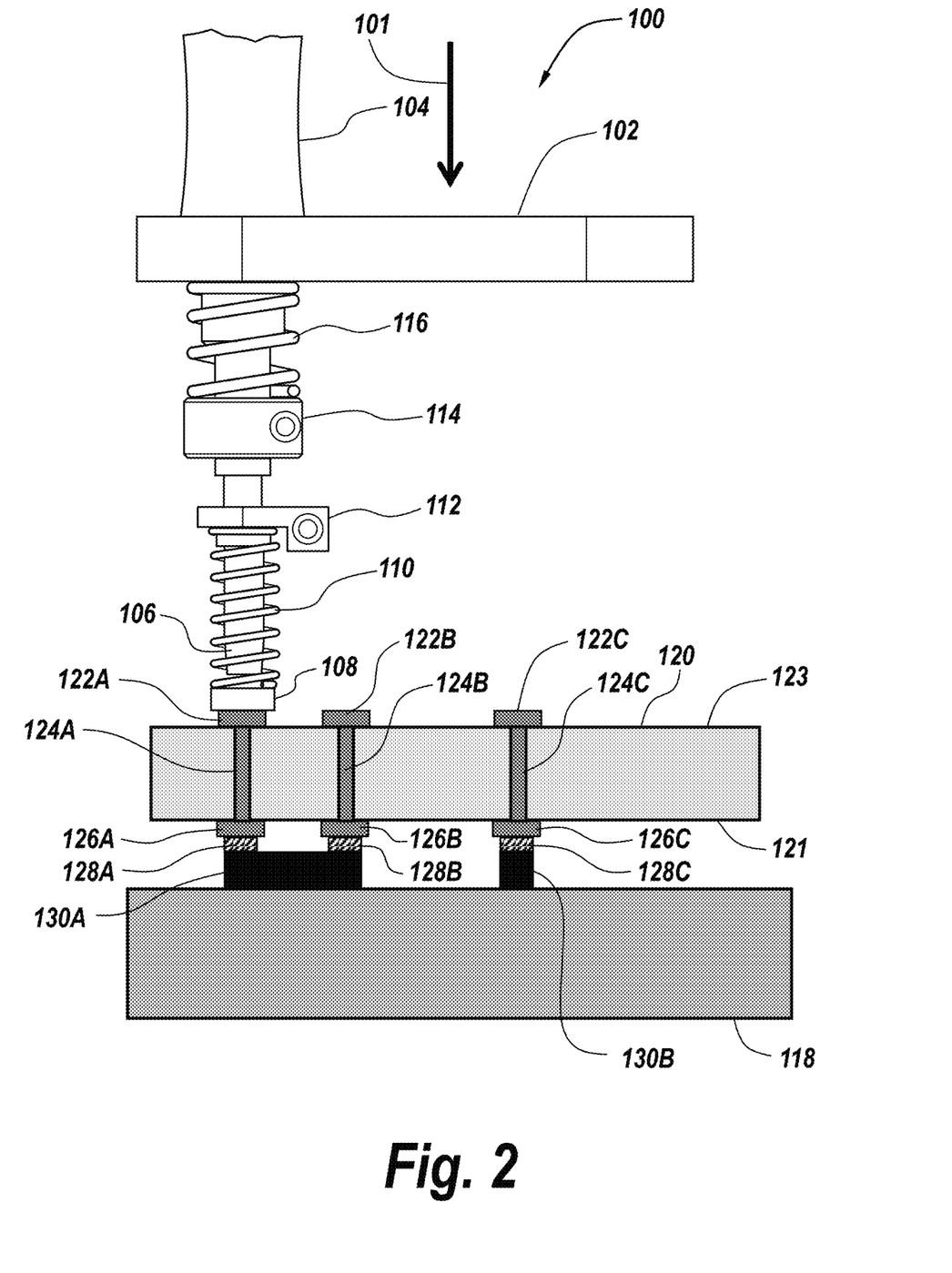

As illustrated in FIG. 1, before the soldering process begins, circuit board 120 is positioned via table or stage 118 such that solder tip 106 is in vertical alignment with pad 122A. Actuator 104 and platform 102 are controlled to be at their top or retracted position before the soldering process begins. In FIG. 2, soldering begins as the soldering assembly is controlled via actuator 104 and platform 102 to move down toward circuit board 120, as indicated by arrow 101. Circuit board compression collar 108 contacts and forces circuit board 120 and component 130A into contact with stage 118. With the spring constant of spring 116 being larger than that of spring 110, spring 110 compresses as force is applied to hold solder pad 126A, solder 128A, the aligned component contact pad and stage 118 together under compression.

Figure 3:
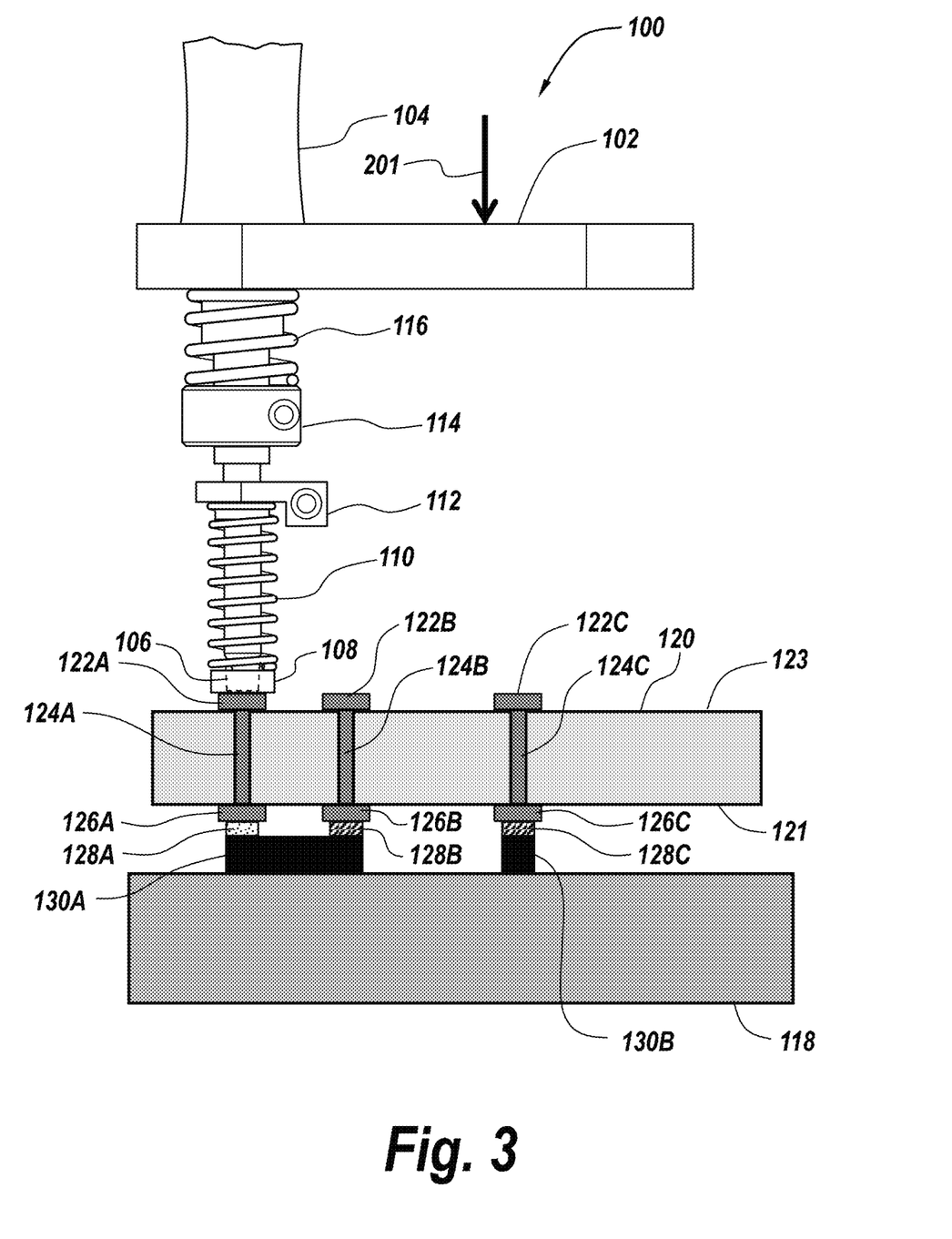

Next, as illustrated in FIG. 3, the soldering assembly is controlled via actuator 104 and platform 102 to move down further toward circuit board 120, as indicated by arrow 201. Activated solder tip 106 makes contact with pad 122A.

Solder tip heat is conducted through pad 122A, plated via 124A and solder pad 126A to solder 128A, which melts to its liquid state, thus reflowing solder 128A.

Figure 4:
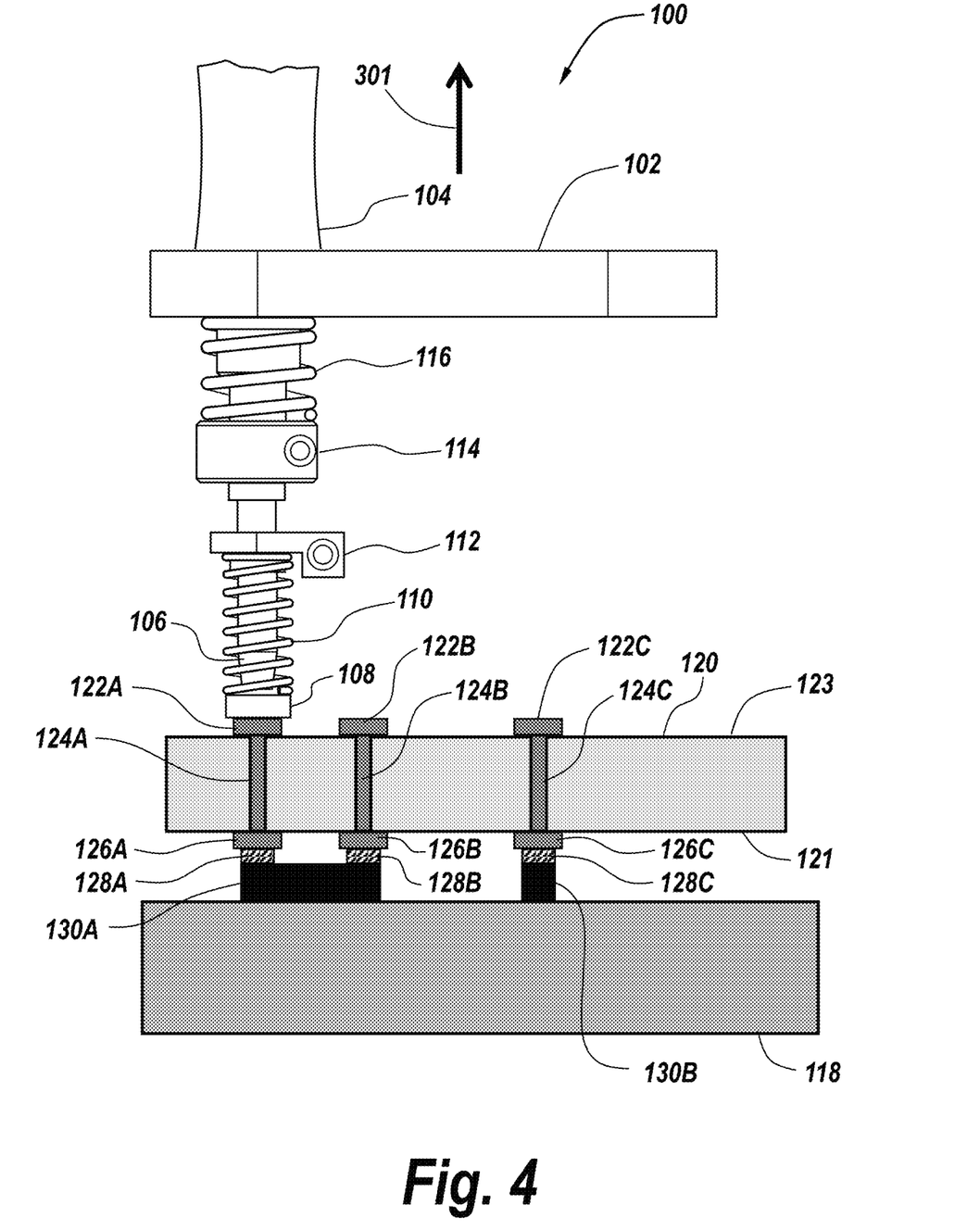

Next, as illustrated in FIG. 4, the soldering assembly is controlled via actuator 104 and platform 102 to move up away from circuit board 120, as indicated by arrow 301. In this step, solder tip 106 is removed from contact with pad 122A, such that heat is removed from solder 128A, while circuit board compression collar 108 maintains the force applied as shown in FIG. 2 to hold solder pad 126A, solder 128A, the aligned component contact pad and stage 118 together under compression. The system remains in this configuration as solder 128A cools and solidifies to create the new reflowed solder joint.

Figure 5:
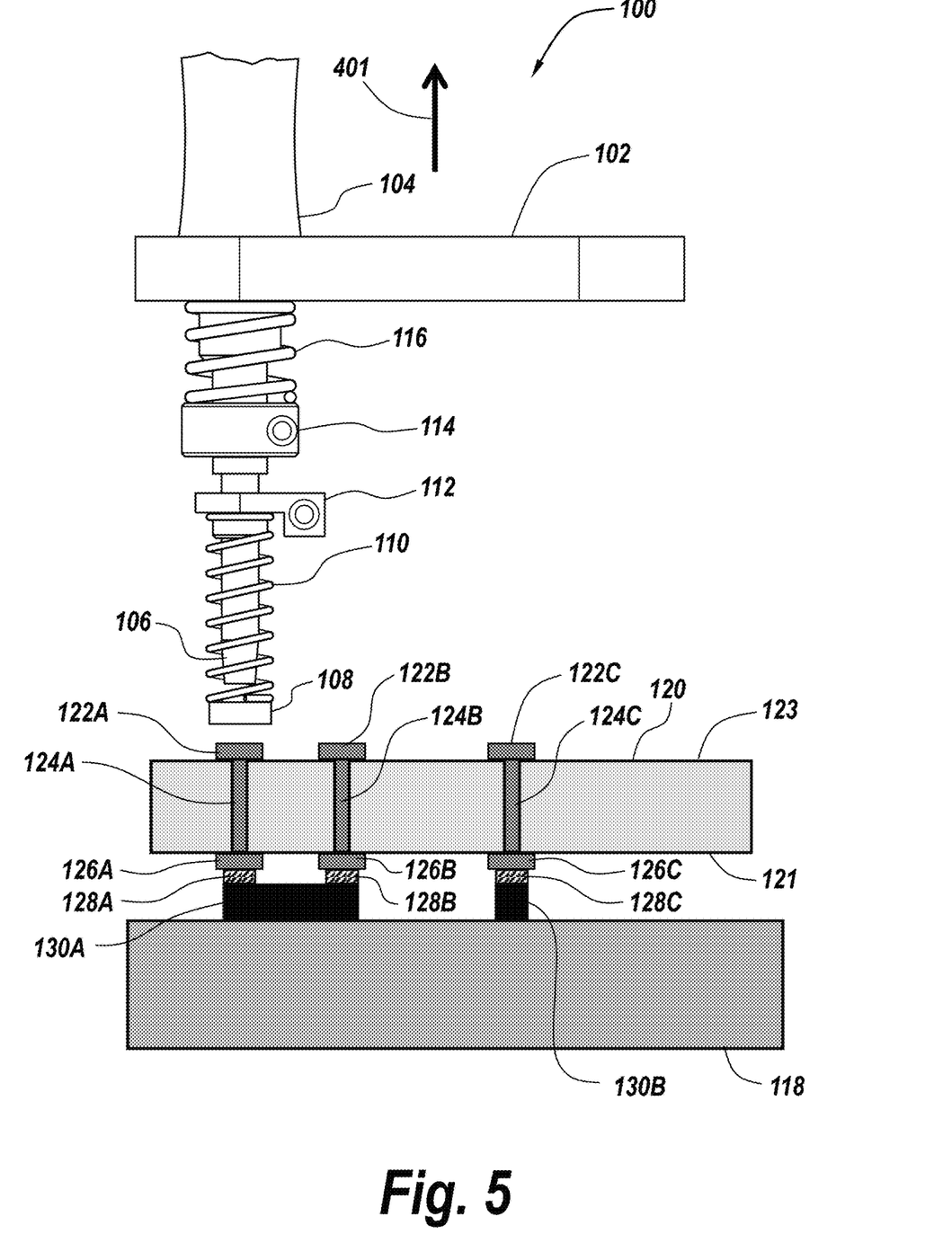

Next, as illustrated in FIG. 5, the soldering assembly is controlled via actuator 104 and platform 102 to move up away from circuit board 120, as indicated by arrow 301, to be at their top or retracted position to complete the soldering process for this particular solder joint. This process can repeated as described above and illustrated in FIGS. 1-5 by positioning another pad, for example, pad 122B, in vertical alignment with solder tip 106, and repeating the steps illustrated in FIGS. 1-5.

Whereas many alterations and modifications of the disclosure will become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. An apparatus for soldering an electrical component to a circuit board, the apparatus comprising:
   a stage configured to position the circuit board and the electrical component in alignment with a soldering tip along an axis;
   a first spring-loaded compression mechanism configured to apply a first force to the circuit board and the electrical component to maintain contact between the circuit board and the electrical component when the first spring-loaded compression mechanism is forced toward the circuit board and the electrical component along the axis; and
   a second spring-loaded compression mechanism configured to apply a second force along the axis to the soldering tip to bring the soldering tip into thermal contact with the circuit board and the electrical component such that solder disposed adjacent to the circuit board and the electrical component melts;
   wherein the first spring-loaded compression mechanism is configured to maintain the contact between the circuit board and the electrical component while the solder cools and solidifies when the second spring-loaded compression mechanism removes the second force such that the soldering tip comes out of thermal contact with the circuit board and the electrical component;
   wherein the first spring-loaded compression mechanism and the second spring-loaded compression mechanism are vertically aligned relative to each other; and
   wherein the first spring-loaded compression mechanism and the second spring-loaded compression mechanism respectively comprise first and second vertically-adjustable force adjusting collars configured to independently control the first and second forces, respectively.

2. The apparatus of claim 1, wherein the first and second spring-loaded compression mechanisms further comprise first and second springs, respectively, a spring constant of the first spring being less than a spring constant of the second spring.

3. The apparatus of claim 2, wherein the first vertically-adjustable force adjusting collar comprises a first annular collar at an end of the first spring, the soldering tip being coaxial with the first spring and movable along the axis through the first annular collar within the first spring.

4. The apparatus of claim 3, wherein the second vertically-adjustable force adjusting collar comprises a second annular collar at an end of the second spring.

5. The apparatus of claim 1, wherein:
   the electrical component is being mounted on a top side of the circuit board; and
   the soldering tip is configured to make contact with a bottom side of the circuit board opposite the top side of the circuit board.

6. The apparatus of claim 1, wherein the apparatus is connectable to a robotic system, the robotic system configured to control positioning of the stage and movement of the first and second spring-loaded compression mechanisms along the axis.

7. A method for soldering an electrical component to a circuit board, the method comprising:
   positioning the circuit board and the electrical component in alignment with a soldering tip along an axis using a stage;
   applying a first force with a first spring-loaded compression mechanism to the circuit board and the electrical component to maintain contact between the circuit board and the electrical component when the first spring-loaded compression mechanism is forced toward the circuit board and the electrical component along the axis; and
   applying a second force with a second spring-loaded compression mechanism along the axis to the soldering tip to bring the soldering tip into thermal contact with the circuit board and the electrical component such that solder disposed adjacent to the circuit board and the electrical component melts;
   wherein, when the second spring-loaded compression mechanism removes the second force such that the soldering tip comes out of thermal contact with the circuit board and the electrical component, the first spring-loaded compression mechanism maintains the contact between the circuit board and the electrical component while the solder cools and solidifies;
   wherein the first spring-loaded compression mechanism and the second spring-loaded compression mechanism are vertically aligned relative to each other; and
   wherein the first spring-loaded compression mechanism and the second spring-loaded compression mechanism respectively comprise first and second vertically-adjustable force adjusting collars configured to independently control the first and second forces, respectively.

8. The method of claim 7, wherein the first and second spring-loaded compression mechanisms further comprise first and second springs, respectively, a spring constant of the first spring being less than a spring constant of the second spring.

9. The method of claim 8, wherein the first vertically-adjustable force adjusting collar comprises a first annular collar at an end of the first spring, the soldering tip being coaxial with the first spring and movable along the axis through the first annular collar within the first spring.

10. The method of claim 9, wherein the second vertically-adjustable force adjusting collar comprises a second annular collar at an end of the second spring.

11. The method of claim 7, wherein:
the electrical component is being mounted on a top side of the circuit board; and
the soldering tip makes contact with a bottom side of the circuit board opposite the top side of the circuit board.

12. The method of claim 7, wherein the method is carried out under control of a robotic system.

13. The apparatus of claim 1, further comprising:
a movable platform coupled to the soldering tip; and
an actuator configured to move the movable platform.

14. The apparatus of claim 13, wherein the first spring-loaded compression mechanism further comprises a circuit board compression collar configured to contact the circuit board.

15. The apparatus of claim 14, wherein the actuator is configured to move the movable platform such that, in order:
the circuit board compression collar contacts the circuit board and applies the first force to the circuit board and the electrical component;
the soldering tip makes thermal contact with a conductive pad on a first side of the circuit board based on the second force to melt the solder on a second side of the circuit board opposite the first side;
the soldering tip is removed from the conductive pad while the circuit board compression collar continues to contact the circuit board and apply the first force to the circuit board and the electrical component; and
the circuit board compression collar is retracted from the circuit board.

16. The apparatus of claim 5, wherein:
the circuit board comprises a first conductive pad on the top side of the circuit board and a second conductive pad on the bottom side of the circuit board;
the soldering tip is configured to make thermal contact with the second conductive pad; and
the circuit board further comprises a conductive via through the circuit board, the conductive via thermally coupling the first and second conductive pads.

17. The method of claim 7, further comprising:
moving a movable platform coupled to the soldering tip using an actuator.

18. The method of claim 17, wherein the first spring-loaded compression mechanism further comprises a circuit board compression collar that contacts the circuit board.

19. The method of claim 18, wherein the actuator is configured to move the movable platform such that, in order:
the circuit board compression collar contacts the circuit board and applies the first force to the circuit board and the electrical component;
the soldering tip makes thermal contact with a conductive pad on a first side of the circuit board based on the second force to melt the solder on a second side of the circuit board opposite the first side;
the soldering tip is removed from the conductive pad while the circuit board compression collar continues to contact the circuit board and apply the first force to the circuit board and the electrical component; and
the circuit board compression collar is retracted from the circuit board.

20. The method of claim 11, wherein:
the circuit board comprises a first conductive pad on the top side of the circuit board and a second conductive pad on the bottom side of the circuit board;
the soldering tip is configured to make thermal contact with the second conductive pad; and
the circuit board further comprises a conductive via through the circuit board, the conductive via thermally coupling the first and second conductive pads.

* * * * *